(12) United States Patent
Takesako et al.

(10) Patent No.: US 9,947,669 B1
(45) Date of Patent: Apr. 17, 2018

(54) DYNAMIC RANDOM ACCESS MEMORY AND METHOD OF MANUFACTURING THE SAME

(71) Applicant: Winbond Electronics Corp., Taichung (TW)

(72) Inventors: Kazuaki Takesako, Kanagawa (JP); Yoshinori Tanaka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/590,023

(22) Filed: May 9, 2017

(51) Int. Cl.
*H01L 27/108* (2006.01)
*H01L 29/06* (2006.01)
*H01L 23/528* (2006.01)

(52) U.S. Cl.
CPC ...... *H01L 27/10888* (2013.01); *H01L 23/528* (2013.01); *H01L 27/108* (2013.01); *H01L 27/10814* (2013.01); *H01L 27/10885* (2013.01); *H01L 29/0649* (2013.01)

(58) Field of Classification Search
CPC ............ H01L 27/10888; H01L 23/528; H01L 27/108; H01L 27/10885; H01L 29/0649; H01L 27/10814
See application file for complete search history.

(56) References Cited

U.S. PATENT DOCUMENTS

| | | | |
|---|---|---|---|
| 7,026,213 B1* | 4/2006 | Lee | H01L 27/11568 257/E21.679 |
| 2012/0012912 A1* | 1/2012 | Kwon | H01L 27/10823 257/302 |
| 2013/0154101 A1* | 6/2013 | Park | H01L 27/10855 257/773 |
| 2014/0231892 A1 | 8/2014 | Song et al. | |
| 2015/0262625 A1* | 9/2015 | Han | H01L 21/764 257/773 |

* cited by examiner

*Primary Examiner* — Fei Fei Yeung Lopez
(74) *Attorney, Agent, or Firm* — JCIPRNET

(57) ABSTRACT

A dynamic random access memory (DRAM) includes a substrate, a plurality of isolation structures, a plurality of conductive structure sets, a plurality of bit-line structures, and a plurality of spacers. The substrate has a plurality of active areas. The isolation structures are located in the substrate and extending along a first direction. Each of the isolation structures is disposed between two adjacent active areas. The conductive structure sets are disposed in parallel along the first direction and on the substrate. The bit-line structures are disposed in parallel along a second direction and on the substrate. The bit-line structures penetrate through the conductive structure sets. The spacers are disposed in parallel along the second direction and on sidewalls of the bit-line structures, so as to electrically isolate the bit-line structures from the conductive structure sets.

20 Claims, 11 Drawing Sheets

A-A'

B-B'

DYNAMIC RANDOM ACCESS MEMORY AND METHOD OF MANUFACTURING THE SAME

BACKGROUND OF THE INVENTION

1. Field of the Invention

The present invention generally relates to a memory and a method of manufacturing the same, in particular, to a dynamic random access memory (DRAM) and a method of manufacturing the same.

2. Description of Related Art

With the continuous development of science and technology, the demands to the storage capability also increases as the electronic products continue to improve. To improve the storage capability, a memory device, specifically, a dynamic random access memory (DRAM), becomes smaller in size and have a greater integration density. Thus, recently researching how to integrate more memory cells into one chip has been ongoing.

However, as the integration density of the DRAM continues to increase, a tapered profile is ease formed in the fabricating a bit line having high aspect ratio. The bit line having the taper profile decreases the size of the capacitor contact, while increase the possibility of the short between the bit line and the capacitor contact. That is, the critical dimension of the DRAM is reduced, which result in an increase of the contact resistance between the capacitor contact and the storage capacitor in the DRAM, thereby decreasing the reliability of the DRAM. Once the misalignment of forming the bit line is occurred, the short between the bit line and the capacitor contact will be more serious.

SUMMARY OF THE INVENTION

The invention provides a dynamic random access memory (DRAM) and a method of manufacturing the same, which increase the contact area between the capacitor contact and the active area, thereby decreasing the contact resistance between the capacitor contact and the active area.

The invention provides a dynamic random access memory (DRAM) and a method of manufacturing the same, which increase the short margin between the capacitor contact and the bit line to enhance the yield and the reliability of the DRAM.

The invention provides a dynamic random access memory (DRAM) and a method of manufacturing the same, which decrease the capacitance between the bit-line structure and the capacitor contact to enhance the sensing margin of the DRAM.

The DRAM includes a substrate, a plurality of isolation structures, a plurality of conductive structure sets, a plurality of bit-line structures, and a plurality of spacers. The substrate has a plurality of active areas that are configured into a strip and arranged as an array. The isolation structures are located in the substrate and extending along a first direction. Each of the isolation structures is disposed between two adjacent active areas. The conductive structure sets are disposed in parallel along the first direction and on the substrate. Each of the conductive structure sets is connected to each of the active areas arranged in the same column, so as to form a first contact region and a second contact region on each of the active areas. The bit-line structures are disposed in parallel along a second direction and on the substrate. The bit-line structures penetrate through the conductive structure sets. Each of the bit-line structures is connected to portions of the active areas arranged in the same column, so as to form a third contact region between the first contact region and the second contact region. The spacers are disposed in parallel along the second direction and on sidewalls of the bit-line structures, so as to electrically isolate the bit-line structures from the conductive structure sets.

The method of manufacturing the DRAM of the invention includes following steps. A substrate having a plurality of active areas is provided. The active areas are configured into a strip and arranged as an array. A plurality of isolation structures are formed in the substrate and extending along a first direction, wherein each of the isolation structures is disposed between two adjacent active areas. A plurality of conductive structure sets are formed in parallel along the first direction and on the substrate. Each of the conductive structure sets is connected to each of the active areas arranged in the same column, so as to form a first contact region and a second contact region on each of the active areas. A plurality of openings are formed and extending along a second direction, wherein portions of the active areas are exposed by the openings. A plurality of spacers are formed on sidewalls of the openings, wherein the spacers are extending along the second direction. A plurality of bit line are formed between the spacers in the openings. Each of the bit-line structures is connected to the portions of the active areas arranged at the same column, so as to form a third contact region between the first contact region and the second contact region.

Based on the above, the invention provides the DRAM and the method of manufacturing the same including forming bit-line structures and spacers disposed on sidewalls of the bit-line structures by a damascene process. The bit-line structures have a sidewall profile perpendicular to a top surface of the substrate. Therefore, the contact area between the capacitor contact and the active area is increased, thereby decreasing the contact resistance between the capacitor contact and the active area. Even if the bit-line structures are misaligned, the short between the bit-line structures and the capacitor contacts is able to be prevent, thereby increasing the short margin between the bit-line structures and the capacitor contacts. Moreover, the capacitance between the bit-line structures and the capacitor contacts decreases by adjusting the material of the spacers on the sidewalls of the bit-line structures. Accordingly, the sensing margin of the DRAM is enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
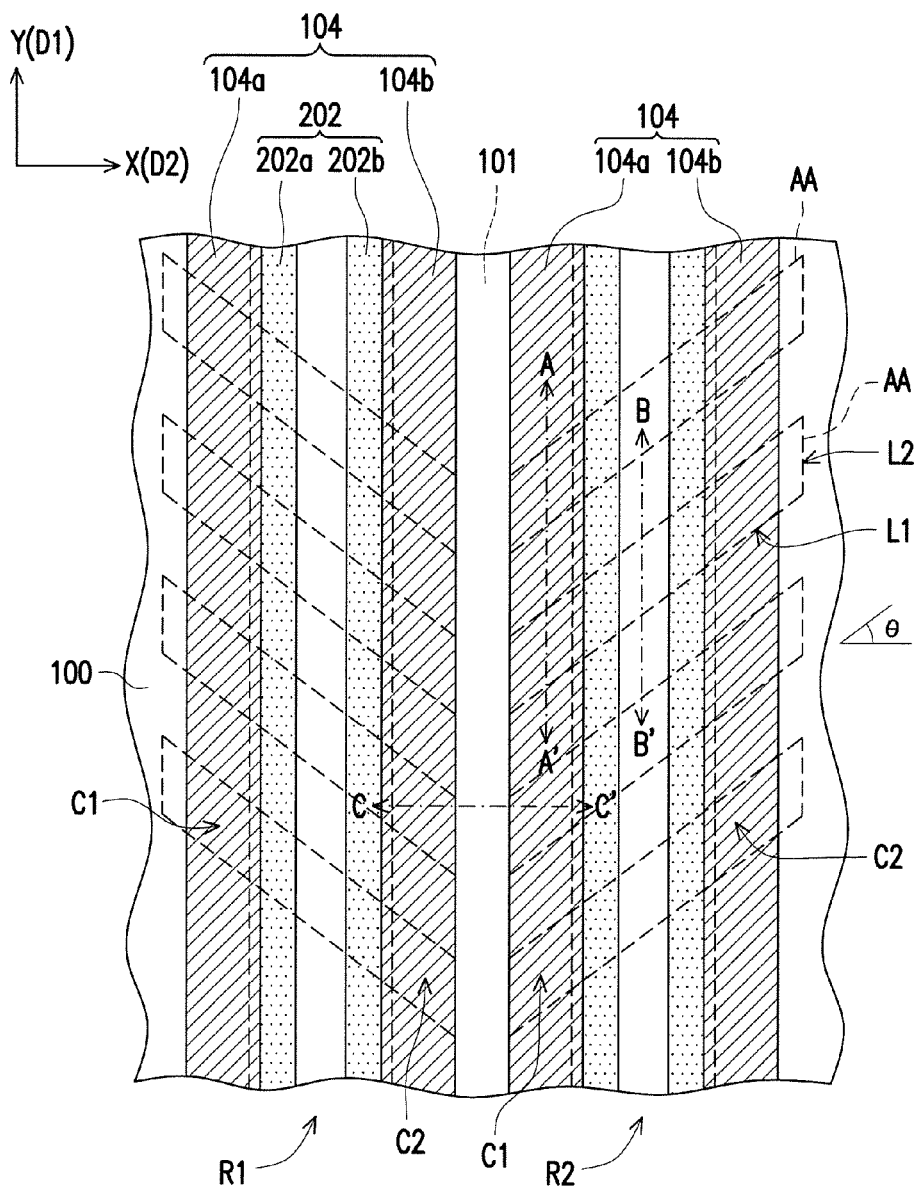
FIG. 1A to FIG. 1D are schematic top views illustrating a process of manufacturing a dynamic random access memory (DRAM) in accordance with a first embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

FIG. 2A to FIG. 2D, FIG. 3A to FIG. 3D, and FIG. 4A to FIG. 4D illustrate various stages in a manufacturing process of a structure of a single memory unit.

Referring to FIGS. 1A, 2A, 3A, and 4A, the first embodiment provides a method of manufacturing the DRAM including the following steps. First, the substrate 100 is provided. In the embodiment, the substrate 100 may be a semiconductor substrate, a semiconductor compound substrate, or a semiconductor over insulator (SOI) substrate, for example. Specifically, the substrate 100 includes a plurality of active areas AA. The active areas AA are configured into strips and arranged as an array. In some embodiments, the active areas AA are arranged into two active area columns R1 and R2, and the two active area columns R1 and R2 are arranged in a mirrored configuration. However, the invention is not limited thereto. In other embodiments, the two active area columns R1 and R2 are arranged in the same configuration. Each of the active areas AA has long sides L1 and short sides L2, and the long sides L1 cross the corresponding word line set 202 (i.e., two buried word lines 202a and 202b). A direction extending along the long sides L1 of the active areas AA is non-orthogonal to the X direction and forms an angle θ. In some embodiments, the angle θ between the direction extending along the long sides L1 of the active areas 104 and a X direction is in a range of 15 degrees to 45 degrees, but the invention is not limited thereto. The range of the angle θ may be affected by parameters, such as the area of the active area AA, a linewidth of the word line set 202, and so on.

A plurality of isolation structures 101 are formed in the substrate 100 and extending along a Y direction (i.e., a first direction D1). Each of the isolation structures 101 is disposed between two adjacent active area columns R1 and R2 (or two adjacent active areas AA), so that the memory units formed in the two active areas AA are separated by a corresponding isolation structure 101. Therefore, interference between the memory units is reduced effectively. In some embodiments, the isolation structures 101 may include silicon oxide, HDP oxide, spin-on silicon oxide, low-k dielectric material, or a combination thereof. The isolation structures 101 may be shallow trench isolation (STI) structure, deep trench isolation (DTI) structure, or a combination thereof.

A plurality of the word line sets 202 are formed in the substrate 100 and extending along the Y direction. Specifically, each of the word line sets 202 includes two buried word lines 202a and 202b. Each of the buried word lines 202a and 202b includes a metal conductor, such as tungsten, tungsten silicide, and titanium nitride, for example. A forming method of the buried word lines 202a and 202b includes a physical vapor deposition (PVD) process or a chemical vapor deposition (CVD) process, for example. An insulating layer (not shown) is further disposed between the buried word lines 202a and 202b and the substrate 100 to serve as a gate dielectric layer. The insulating layer includes silicon oxide, for example, and a forming method thereof includes performing a thermal oxidation process in a furnace tube.

Figure 2A:
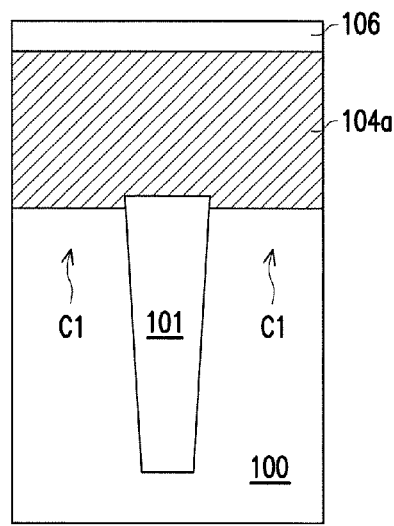
FIG. 2A to FIG. 2D are schematic cross-sectional views of the DRAM taken along the line section A-A' of FIG. 1A to FIG. 1D.
Figures 3A, 4A:
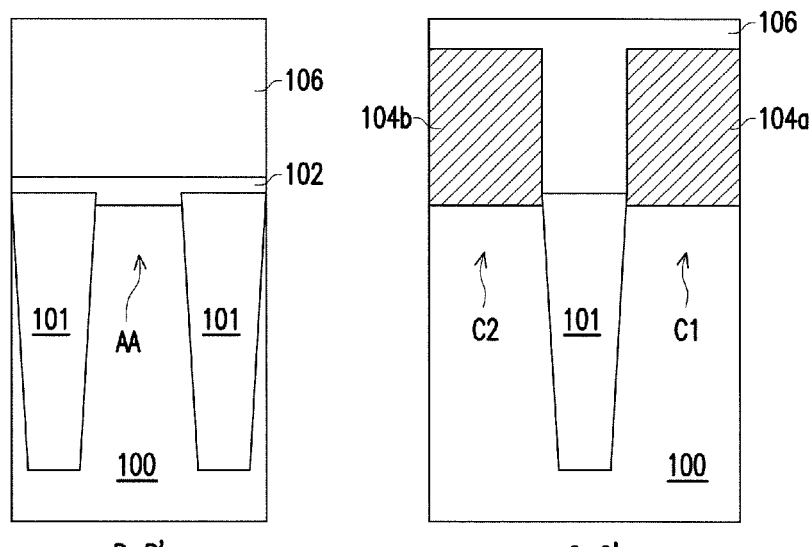
FIG. 3A to FIG. 3D are schematic cross-sectional views of the DRAM taken along the line section B-B' of FIG. 1A to FIG. 1D.
FIG. 4A to FIG. 4D are schematic cross-sectional views of the DRAM taken along the line section C-C' of FIG. 1A to FIG. 1D.
Figures 3B, 4B:
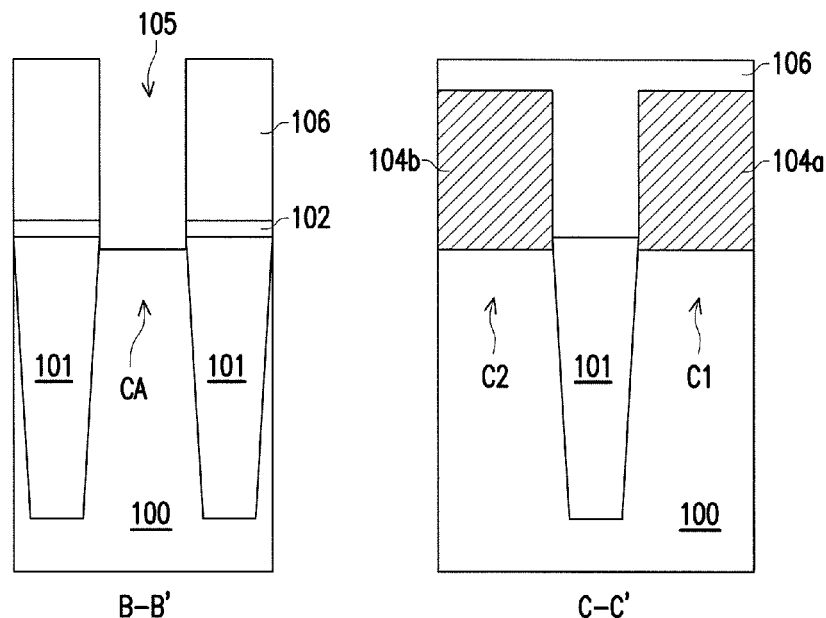
Figures 3C, 4C:
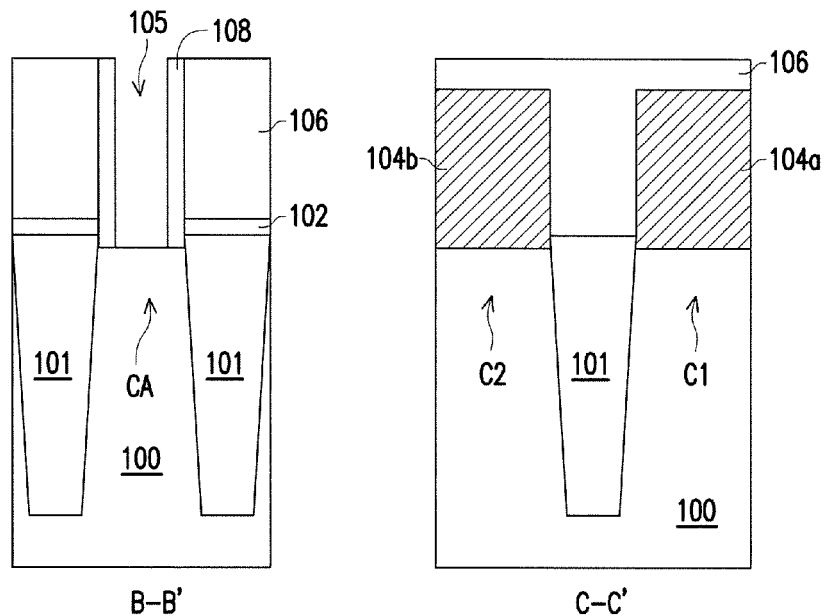

As shown in FIGS. 2A, 3A, and 4A, a pad oxide 102 is formed on the substrate 100. In some embodiments, the pad oxide 102 may include silicon oxide, and be formed by a CVD process. The pad oxide 102 is then patterned to expose a portion of a top surface of the substrate 100.

After patterning the pad oxide 102, a plurality of conductive structure sets 104 is formed on the exposed portion of the top surface of the substrate 100. As shown in FIG. 1A, the conductive structure sets 104 are disposed in parallel along the Y direction, so that each of the word line sets 202 is disposed between the corresponding conductive structures 104a and 104b. The conductive structure 104a partially overlaps with adjacent buried word lines 202a; and the conductive structure 104b partially overlaps with adjacent buried word lines 202b. The conductive structure sets 104 are extending along the Y direction and are alternately arranged along the X direction (i.e., a second direction D2). Specifically, each of the conductive structure sets 104 includes two conductive structures 104a and 104b. Each of the conductive structures 104a and 104b is connected to or in contact with each of the active areas AA arranged in the same column, so as to form a first contact region C1 and a second contact region C2 on each of the active areas AA. The first contact region C1 and the second contact region C2 are disposed at two terminal of the long side L1 of each of the active areas AA. In some embodiments, the conductive structure sets 104 may include poly-Si, SiGe, SiC or a combination thereof, and be formed by a CVD process, an epitaxial growth process, etc.

As shown in FIGS. 2A, 3A, and 4A, a dielectric layer 106 is formed on the substrate 100, so that the dielectric layer 106 is filled in the spaces between the conductive structures 104a and 104b and between two adjacent conductive structure sets 104. In addition, the dielectric layer 106 also covers a top surface of the conductive structure sets 104. In some embodiments, the dielectric layer 106 may include silicon nitride, and be formed by a CVD process.

Figure 1B:
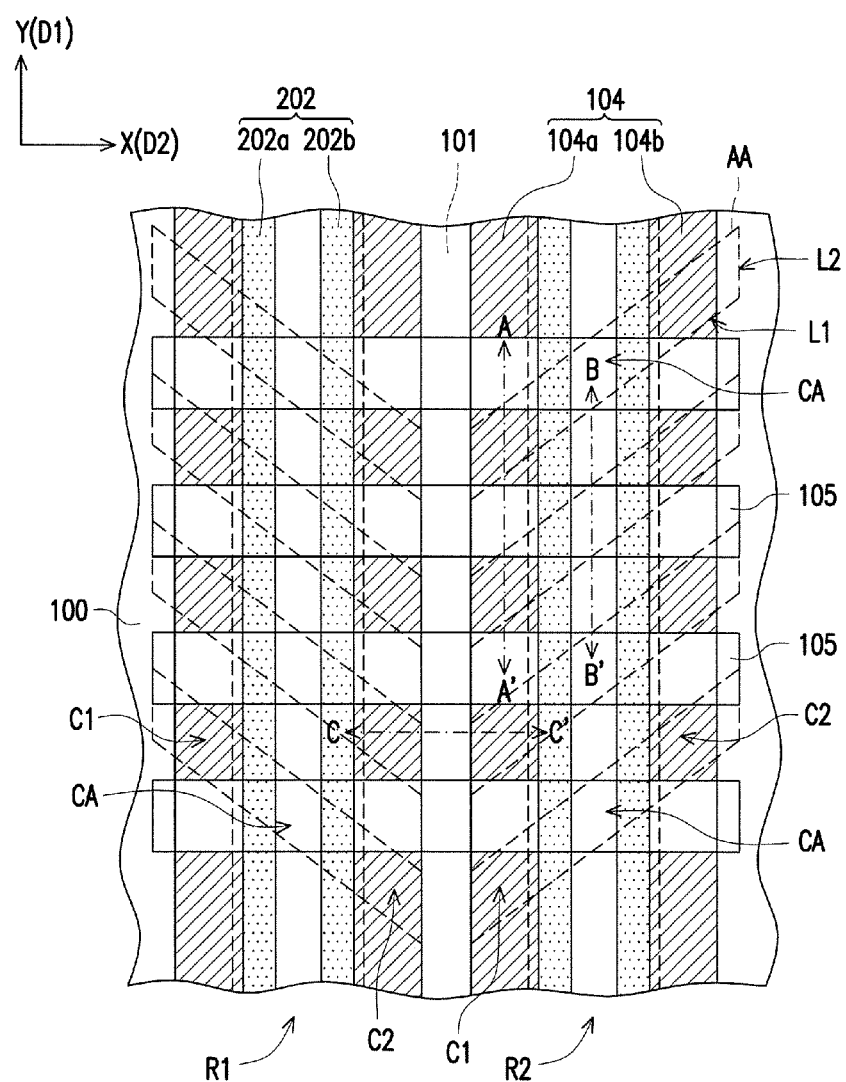
Figure 1C:
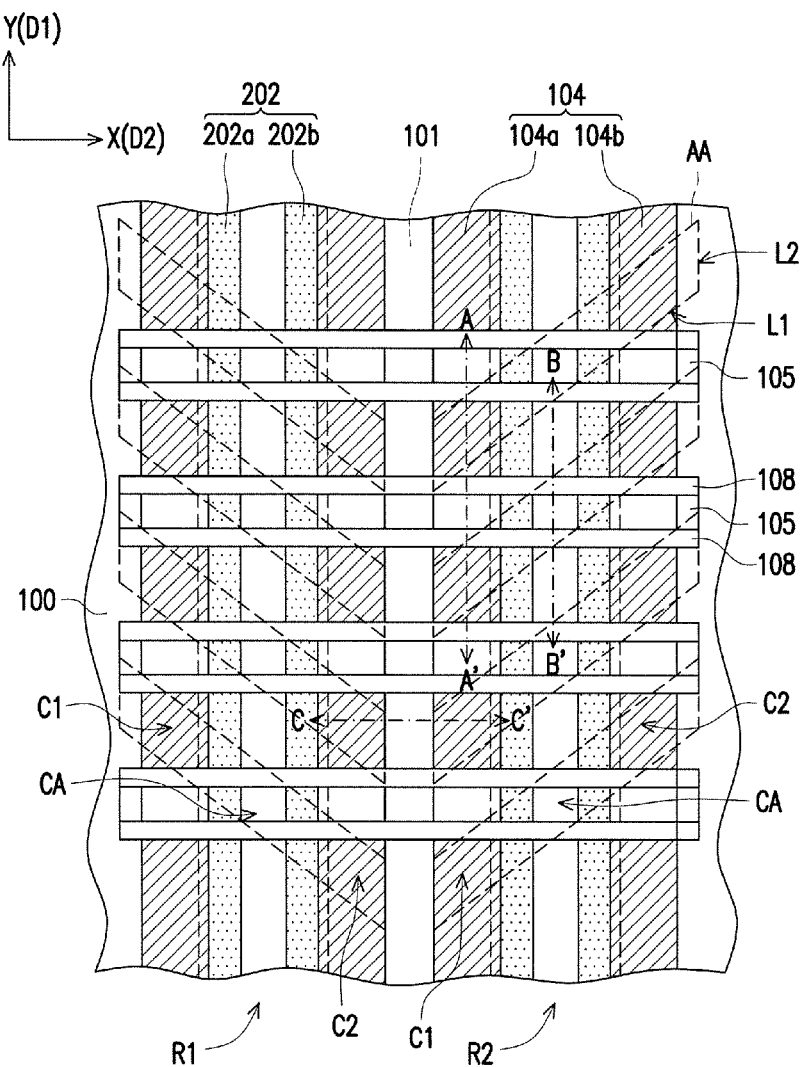
Figure 1D:
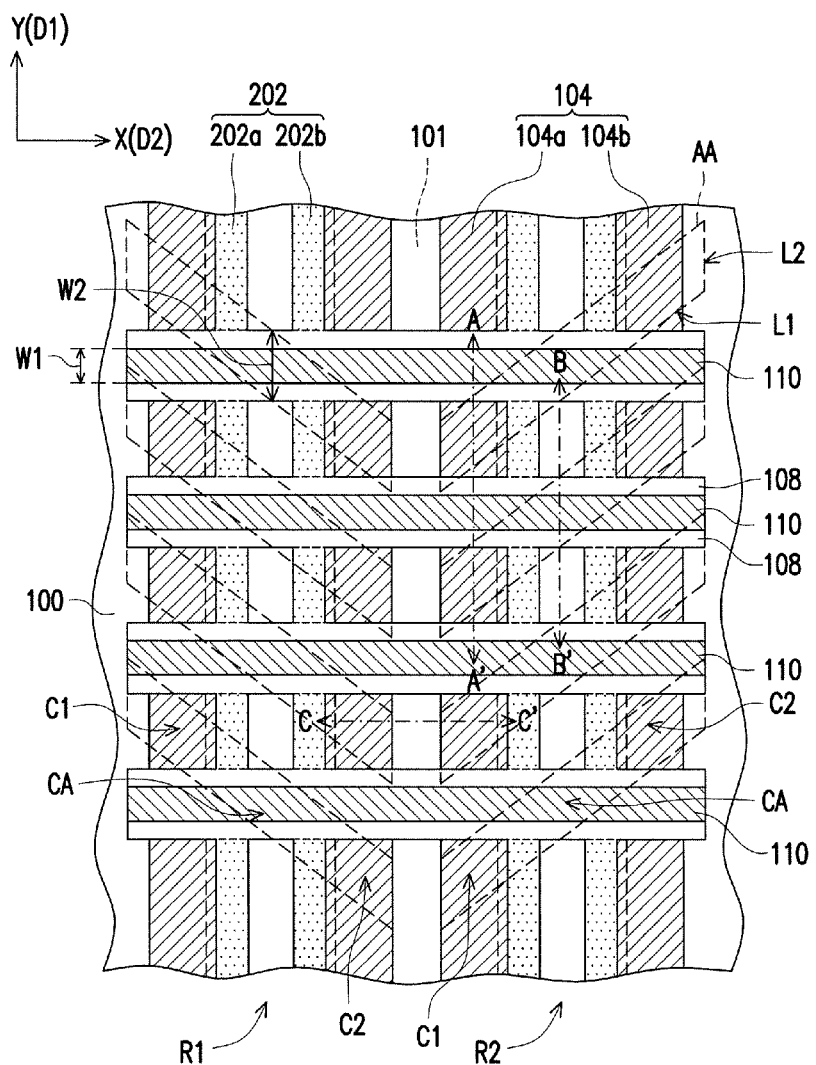

Referring to FIGS. 1B, 2B, 3B, and 4B, a plurality of openings 105 are formed in the dielectric layer 106 and the conductive structure sets 104. The openings 105 penetrate through the dielectric layer 106 and the conductive structure sets 104, so that portions of top surfaces of the active areas AA are exposed by the openings 105. Specifically, the openings 105 are configured into strips extending along the X direction (i.e., the second direction D2) and alternately arranged along the Y direction (i.e., the first direction D1). The exposed portions of the top surfaces of the active areas AA are referred as third contact regions CA, the third contact regions CA are in contact with bit-line structures 110 formed subsequently (as shown in FIG. 1D). As shown in FIG. 1B, the third contact regions CA of the active areas AA arranged in the same column are sandwiched by respective two buried word lines 202*a* and 202*b*.

Referring to FIGS. 1C, 2C, 3C, and 4C, after forming the openings 105, a plurality of spacers 108 are respectively formed on sidewalls of the openings 108. In detail, the spacers 108 extend along the X direction, so as to electrically isolate the conductive structure sets 104 from the bit-line structures 110 formed subsequently (as shown in FIG. 1D). A manufacturing steps of the spacers 108 are well known by those who are skilled in the art. So it's not detailed herein. In the embodiment, the spacers 108 may be single-layer structures with silicon oxide, and be formed by a CVD process. However, the invention is not limited thereto. In other embodiments, the spacers 108 may be single-layer structures with silicon nitride, two-layer structures with silicon oxide and silicon nitride. In alternative embodiments, the spacers 108 may include a low dielectric constant (low-k) material having a lower dielectric constant than 4.

Figure 7:
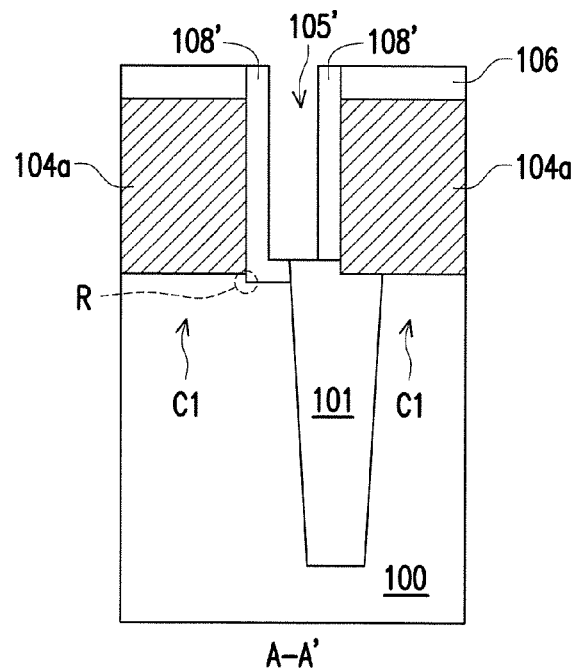
FIG. 7 are schematic cross-sectional views of a DRAM taken along the line section A-A' of FIG. 1C in accordance with a fourth embodiment of the invention.
Figure 8:
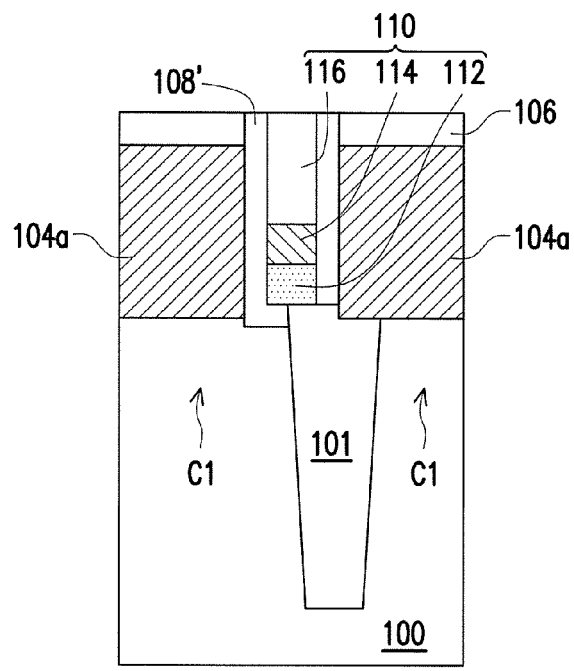
FIG. 8 are schematic cross-sectional views of a DRAM taken along the line section A-A' of FIG. 1D in accordance with a fourth embodiment of the invention.

Noted that the capacitance between the bit-line structures 110 formed subsequently (as shown in FIG. 1D) and the conductive structure sets 104 (e.g., capacitor contacts) may decrease by adjusting the material of the spacers 108 as silicon oxide or the low-k material. Accordingly, the sensing margin of the DRAM is enhanced. On the other hand, the spacers 108 are continuous structures and are configured as strips. Therefore, as shown in FIG. 7, when the opening 105' are misaligned, recesses R are formed by a little silicon loss. The recesses R between the active area AA and the isolation structures 101 may be filled by the spacers 108', so as to prevent the short between the bit-line structures 110 formed subsequently (as shown in FIG. 1D and FIG. 8) and the conductive structure sets 104 (e.g., capacitor contacts).

Referring to FIGS. 1D, 2D, 3D, and 4D, after forming the spacers 108, a plurality of bit-line structures 110 are respectively formed between the spacers 108 in the openings 105. In detail, each of the bit-line structures 110 includes a bit-line contact 112, a bit line 114, and a cap layer 116. The bit-line contact 112 is located between the bit line 114 and the third contact region CA (e.g., a bit-line contact region), so as to electrically connect the bit line 114 and the third contact region CA. In some embodiments, the bit-line contact 112 may include polysilicon layers, and be formed by a CVD process. The bit line 114 may be a conductive material which includes W, Cu, Al, etc., and be formed by a CVD process, a physical vapor deposition (PVD) process, etc. The cap layer 116 may include silicon nitride, and be formed by a CVD process.

After forming the bit-line structures 110, a planarization process is performed to expose top surfaces of the conductive structures 104*a* and 104*b*. A plurality of capacitors (not shown) are then respectively formed on the conductive structures 104*a* and 104*b* respectively on the first contact region C1 and the second contact region C2. In the embodiment, the conductive structures 104*a* and 104*b* are referred as the capacitor contacts, so as to electrically connect the capacitors and the active areas AA.

Figure 2B:
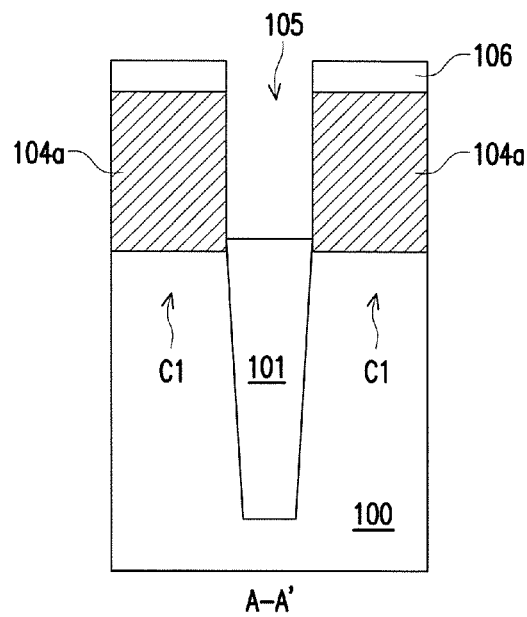
Figure 2C:
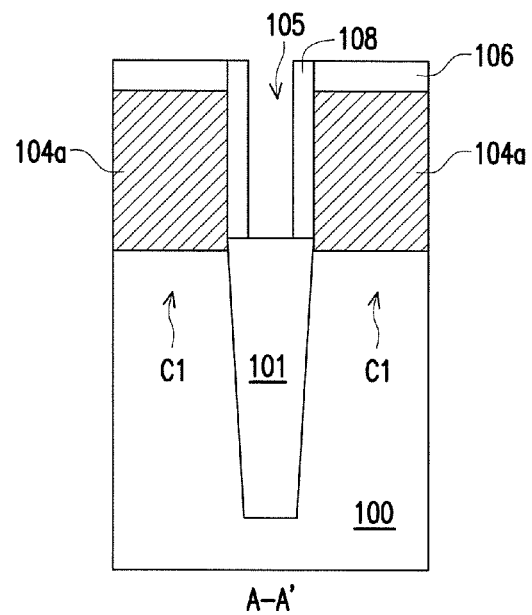
Figure 2D:
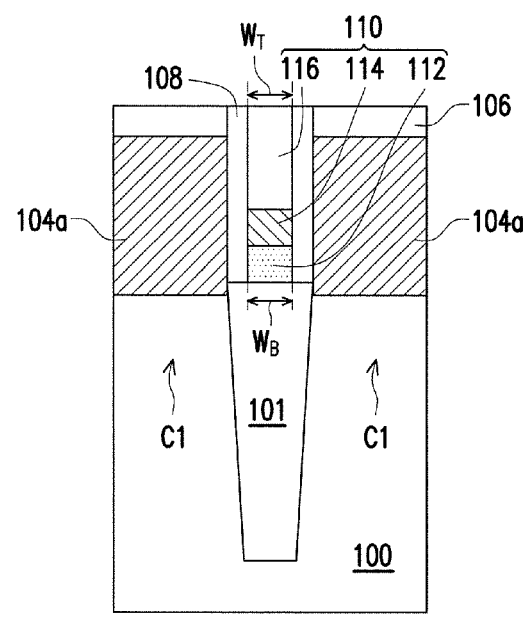
Figure 3D:
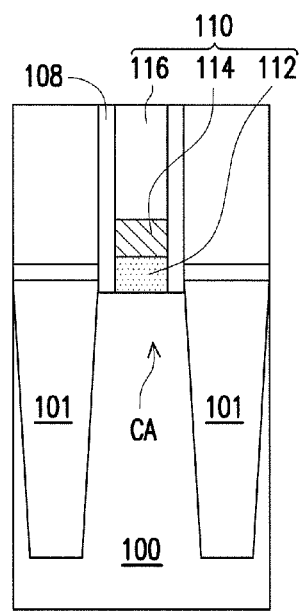
Figure 4D:
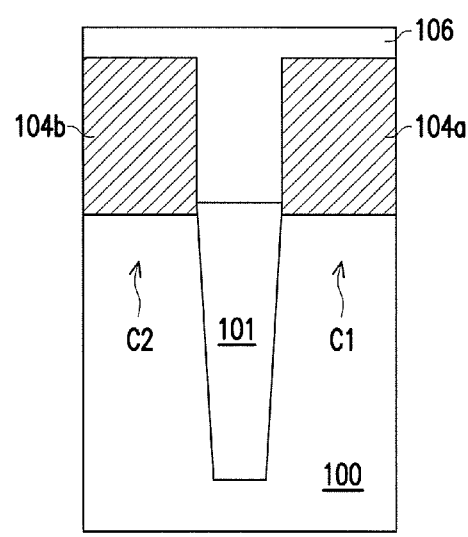

It should be noted that the method of forming the DRAM of the first embodiment includes forming the bit-line structures 110 and the spacers 108 disposed on sidewalls of the bit-line structures 110 by a damascene process. Therefore, the taper profile of the bit-line structure with high aspect ratio is avoided. As shown in FIGS. 2D and 3D, the bit-line structures 110 have a sidewall profile perpendicular to the top surface of the substrate 100, namely, a top width $W_T$ of each of the bit-line structures 110 is substantial equal to a bottom width $W_B$ of each of the bit-line structures 110. Therefore, the contact area between the conductive structure sets 104 (e.g., capacitor contacts) and the active areas AA is increased, thereby decreasing the contact resistance between the capacitor contacts and the active areas AA.

On the other hand, as shown in FIG. 1D, a width W1 of each of the bit-line structures 110 is less than a width W2 at the short side L2 of each of the active areas AA. That is, as shown in FIG. 8, even if the bit-line structures 110 are misaligned, the short between the bit-line structures 110 and the conductive structure sets 104 (e.g., capacitor contacts) through the active areas AA (e.g., the first contact region C1 or the second contact region C2) is able to be prevent, thereby increasing the short margin between the bit-line structures 110 and the capacitor contacts.

Figure 5A:
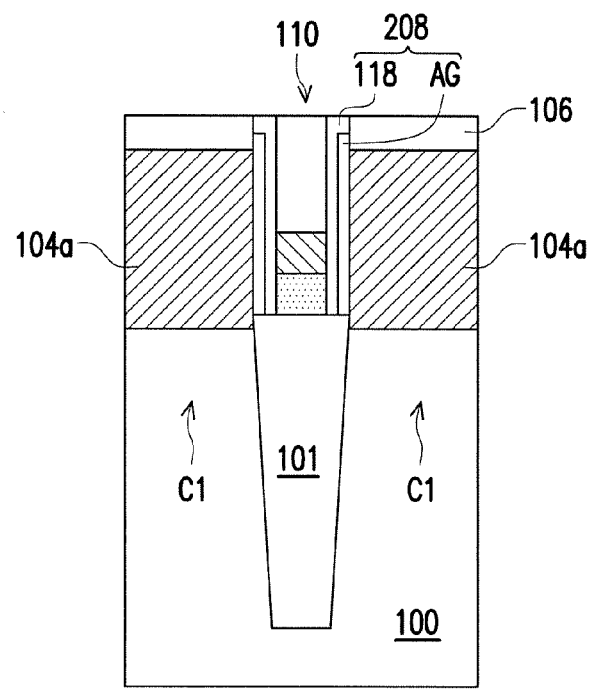
FIG. 5A and FIG. 5B are schematic cross-sectional views of a DRAM taken along the line section A-A' and the line section B-B' of FIG. 1D in accordance with a second embodiment of the invention.
Figure 5B:
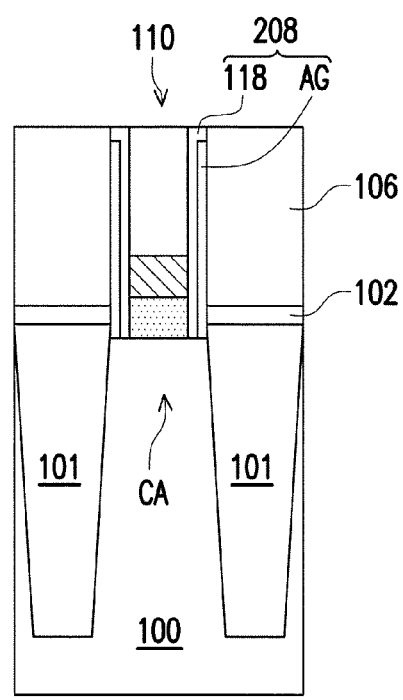

Referring to FIGS. 5A and 5B, a DRAM of the second embodiment is similar to the DRAM of the first embodiment. The difference between the two is that the spacers 208 of the second embodiment include air gaps AG. Specifically, each of the spacers 208 may be a two-layer structure including a dielectric material 118 and an air gap AG. The dielectric material 118 is disposed between the bit-line structure 110 and the air gap AG. However, the invention is not limited thereto. In other embodiments, the spacers may be a multi-layer structure including at least one air gap. In some embodiments, the dielectric material 118 may include silicon oxide, silicon nitride, or the low-k dielectric material, and be formed by a CVD process. Noted that the capacitance between the bit-line structures 110 and the conductive structure sets 104 (e.g., capacitor contacts) may decrease by the spacers 208 with the air gaps AG. Accordingly, the sensing margin of the DRAM is further enhanced.

Figure 6A:
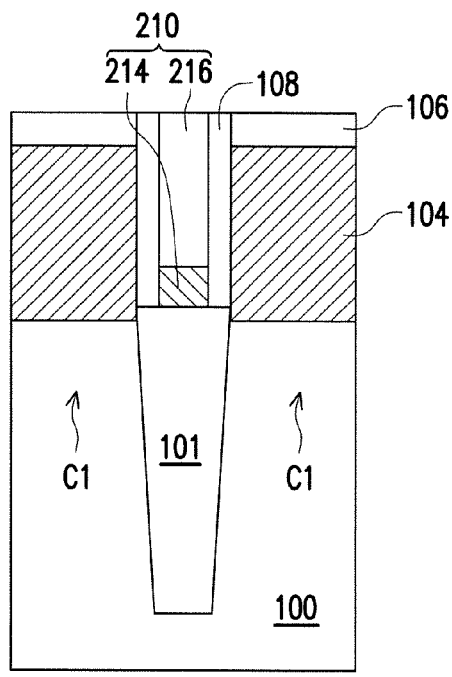
FIG. 6A and FIG. 6B are schematic cross-sectional views of a DRAM taken along the line section A-A' and the line section B-B' of FIG. 1D in accordance with a third embodiment of the invention.
Figure 6B:
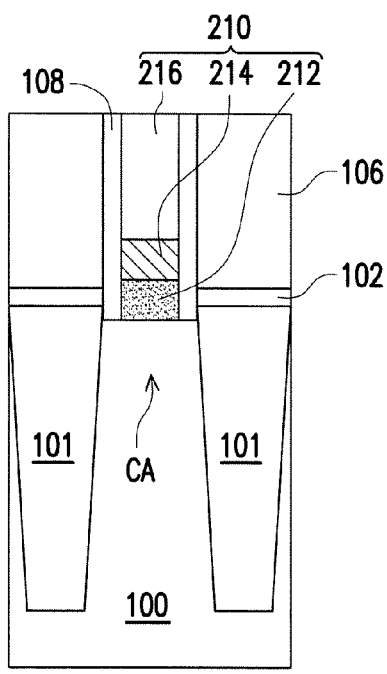

Referring to FIGS. 6A and 6B, a DRAM of the third embodiment is similar to the DRAM of the first embodiment. The difference between the two is that a bit-line contact 212 of a bit-line structure 210 of the third embodiment include epitaxial silicon layer. The method of forming the bit-line structure 210 may include following steps. The bit-line contact 212 is formed on the exposed surface of the substrate 100 by a selective epitaxial growth (SEG) process. That is, the bit-line contact 212 is only formed on the substrate 100 made of silicon, while not formed on the isolation structure 101. Therefore, the bit-line contact 212 is configured into a block and not configured into a strip. Then, a bit line 214 and a cap layer 216 are formed in order on the bit-line contact 212. The material and forming method of the bit line 214 and the cap layer 216 are similar to the material and forming method of the bit line 114 and the cap layer 116 and thus detailed descriptions thereof are omitted hereinafter. Noted that the bit-line structure 210 shown in FIG. 6A only includes the bit line 214 and the cap layer 216. The bit-line structure 210 shown in FIG. 6B includes the bit-line contact 212, the bit line 214, and the cap layer 216.

In summary, the invention provides the DRAM and the method of manufacturing the same including forming bit-line structures and spacers disposed on sidewalls of the bit-line structures by a damascene process. The bit-line structures have a sidewall profile perpendicular to a top surface of the substrate. Therefore, the contact area between the capacitor contact and the active area is increased, thereby decreasing the contact resistance between the capacitor contact and the active area. Even if the bit-line structures are misaligned, the short between the bit-line structures and the capacitor contacts is able to be prevent, thereby increasing the short margin between the bit-line structures and the capacitor contacts. Moreover, the capacitance between the bit-line structures and the capacitor contacts decreases by adjusting the material of the spacers on the sidewalls of the bit-line structures. Accordingly, the sensing margin of the DRAM is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random access memory (DRAM) comprising:
   a substrate having a plurality of active areas that are configured into a strip and arranged as an array;
   a plurality of isolation structures located in the substrate and extending along a first direction, wherein each of the isolation structures is disposed between two adjacent active areas;
   a plurality of conductive structure sets disposed in parallel along the first direction and on the substrate, wherein each of the conductive structure sets is connected to each of the active areas arranged in the same column, so as to form a first contact region and a second contact region on each of the active areas;
   a plurality of bit-line structures disposed in parallel along a second direction and on the substrate, wherein the bit-line structures penetrate through the conductive structure sets and each of the bit-line structures is connected to portions of the active areas arranged in the same column, so as to form a third contact region between the first contact region and the second contact region; and
   a plurality of spacers disposed in parallel along the second direction and on sidewalls of the bit-line structures, so as to electrically isolate the bit-line structures from the conductive structure sets.

2. The DRAM according to claim 1, further comprising a plurality of word line sets located in the substrate and extending along the first direction, wherein each of the word line sets has two buried word lines, and the third contact regions of the active areas arranged in the same column are sandwiched by the two buried word lines.

3. The DRAM according to claim 2, wherein each of the bit-line structures comprises a bit-line contact, a bit line, and a cap layer, the bit-line contact located between the bit line and the third contact region, so as to electrically connect the bit line and the third contact region.

4. The DRAM according to claim 3, wherein the bit-line contacts comprise polysilicon layers, epitaxial silicon layers, or a combination thereof.

5. The DRAM according to claim 1, wherein the spacers comprise single-layer structures, two-layer structures, or multi-layer structures.

6. The DRAM according to claim 1, wherein each of the spacers comprises silicon oxide, air gap, silicon nitride, or a combination thereof.

7. The DRAM according to claim 1, wherein a top width of each of the bit-line structures is substantial equal to a bottom width of each of the bit-line structures.

8. The DRAM according to claim 7, wherein a width of each of the bit-line structures is less than a width at a short side of each of the active areas.

9. The DRAM according to claim 1, wherein the conductive structure sets being in contact with the first contact regions and the second contact regions are capacitor contacts.

10. The DRAM according to claim 9, wherein each of the capacitor contacts comprises poly-Si, SiGe, SiC or a combination thereof.

11. The DRAM according to claim 1, wherein the active areas in two adjacent columns are arranged in a mirrored configuration.

12. The DRAM according to claim 11, wherein an angle is between a direction extending along long sides of the active areas and the second direction, the angle is non-orthogonal.

13. A method of manufacturing a dynamic random access memory (DRAM) comprising:
   providing a substrate having a plurality of active areas that are configured into a strip and arranged as an array;
   forming a plurality of isolation structures located in the substrate and extending along a first direction, wherein each of the isolation structures is disposed between two adjacent active areas;
   forming a plurality of conductive structure sets disposed in parallel along the first direction and on the substrate, wherein each of the conductive structure sets is connected to each of the active areas arranged in the same column, so as to form a first contact region and a second contact region on each of the active areas;
   forming a plurality of openings extending along a second direction, wherein portions of the active areas are exposed by the openings;
   forming a plurality of spacers on sidewalls of the openings, wherein the spacers are extending along the second direction; and
   forming a plurality of bit-line structures between the spacers in the openings, wherein each of the bit-line structures is connected to the portions of the active areas arranged in the same column, so as to form a third contact region between the first contact region and the second contact region.

14. The method of manufacturing the DRAM according to claim 13, before forming the openings, the method further comprising forming a dielectric layer on the conductive structure sets, wherein the dielectric layer is filled in spaces between the conductive structure sets, so that the openings penetrate through in the dielectric layer and the conductive structure sets.

15. The method of manufacturing the DRAM according to claim 13, wherein each of the bit-line structures comprises a bit-line contact, a bit line, and a cap layer, the bit-line contact located between the bit line and the third contact region, so as to electrically connect the bit line and the third contact region.

16. The method of manufacturing the DRAM according to claim 15, wherein a forming method of the bit-line contacts comprises a chemical vapor deposition (CVD) process, a selective epitaxial growth (SEG) process, or a combination thereof.

17. The method of manufacturing the DRAM according to claim 13, wherein the spacers comprise single-layer structures, two-layer structures, or multi-layer structures.

18. The method of manufacturing the DRAM according to claim 13, wherein each of the spacers comprises silicon oxide, air gap, silicon nitride, or a combination thereof.

19. The method of manufacturing the DRAM according to claim 13, wherein the conductive structure sets being in contact with the first contact regions and the second contact regions are capacitor contacts.

20. The method of manufacturing the DRAM according to claim 13, further comprising forming a plurality of word line sets located in the substrate and extending along the first direction, wherein each of the word line sets has two buried word lines, and the third contact regions of the active areas arranged in the same column are sandwiched by the two buried word lines.

* * * * *